United States Patent
Tang (10) Patent No.: US 10,295,853 B2
(45) Date of Patent: May 21, 2019

(54) MANUFACTURING METHODS OF DISPLAY PANELS

(71) Applicant: Wuhan China Star Optoelectronics Technology Co., Ltd., Wuhan, Hubei (CN)

(72) Inventor: Yuejun Tang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 130 days.

(21) Appl. No.: 15/327,991

(22) PCT Filed: Dec. 29, 2016

(86) PCT No.: PCT/CN2016/113213
§ 371 (c)(1),
(2) Date: Jan. 20, 2017

(87) PCT Pub. No.: WO2018/119937
PCT Pub. Date: Jul. 5, 2018

(65) Prior Publication Data
US 2018/0210264 A1    Jul. 26, 2018

(51) Int. Cl.
*H01L 27/32* (2006.01)
*H01L 51/00* (2006.01)
(Continued)

(52) U.S. Cl.
CPC ...... *G02F 1/133305* (2013.01); *G02F 1/1341* (2013.01); *G02F 1/133351* (2013.01);
(Continued)

(58) Field of Classification Search
CPC ......... H01L 2251/5338; H01L 51/0097; H01L 51/5253; H01L 51/003; H01L 27/3244; H01L 2227/326
See application file for complete search history.

(56) References Cited

U.S. PATENT DOCUMENTS

2009/0061721 A1* 3/2009 Isa ............ H01L 27/1214
445/24
2012/0081640 A1 4/2012 Kim
(Continued)

FOREIGN PATENT DOCUMENTS

CN        103995377 A    8/2014
CN        104425773 A    3/2015
(Continued)

*Primary Examiner* — Jaehwan Oh
*Assistant Examiner* — John M Parker
(74) *Attorney, Agent, or Firm* — Andrew C. Cheng (57) ABSTRACT

A manufacturing method of display panels includes providing at least two glass substrates having a predetermined dimension, configuring the glass substrate to be spaced apart from a supporting substrate, forming at least one planarization portion between a gap of the glass substrates and forming a flexible substrate above the planarization portion and the glass substrates, forming a bonding area on the flexible substrate, conducting a cell-formation process or an encapsulation process of the display panel, stripping the supporting substrate, and cutting the flexible substrate via the gap between the glass substrates. In view of the above, the thicker supporting substrate is configured to support the glass substrate so as to avoid two ends of the thinner glass substrate from dropping and curing, which enhances the convenience and the precision of the manufacturing process of the display panel.

10 Claims, 5 Drawing Sheets

(51) Int. Cl.
*H01L 51/56* (2006.01)
*G02F 1/1333* (2006.01)
*G02F 1/1341* (2006.01)

(52) U.S. Cl.
CPC ...... *H01L 27/3241* (2013.01); *H01L 51/0097* (2013.01); *H01L 51/56* (2013.01); *G02F 2001/133302* (2013.01); *G02F 2001/133354* (2013.01); *G02F 2001/133357* (2013.01)

(56) References Cited

U.S. PATENT DOCUMENTS

| | | | |
|---|---|---|---|
| 2015/0048329 A1* | 2/2015 | Kim | H01L 51/5253 257/40 |
| 2016/0066409 A1* | 3/2016 | Kwon | H05K 1/028 174/254 |
| 2016/0266426 A1* | 9/2016 | Song | G02F 1/13306 |
| 2017/0032737 A1* | 2/2017 | Lee | G09G 3/3225 |
| 2017/0278878 A1* | 9/2017 | Kuwabara | H01L 21/67092 |

FOREIGN PATENT DOCUMENTS

| | | |
|---|---|---|
| CN | 105974626 A | 9/2016 |
| CN | 106154609 A | 11/2016 |

\* cited by examiner

MANUFACTURING METHODS OF DISPLAY PANELS

BACKGROUND OF THE INVENTION

1. Field of the Invention

The present disclosure relates to display panel manufacturing technology, and more particularly to a manufacturing method of display panels, and further particularly to a manufacturing method of liquid crystal display panel and organic electroluminescent display panels.

2. Discussion of the Related Art

Display devices are developed with a thin and light trend, in particularly, users demand thin-type electronic devices have been increased. Flat display devices, such as liquid crystal devices (LCDs) or organic light emitting diode (OLED) displays adopted in portable electronic devices are required to have a thinner thickness and a lighter weight so as to improve the portability of the electronic devices. In addition, with respect to the large-scale electronic products, such as TV, thin and light display devices may save the space to provide more comfortable user experience.

With respect to flat display devices, usually, a glass substrate is adopted to be the carrier of other display components, and the glass substrate is the one with biggest weight. In order to reduce the thickness and the weight of the flat display devices, the most effective way is to reduce the thickness the weight of the glass substrate. However, thinner glass substrate may be easily bent, and may have drooping or curving issues during the manufacturing process. There are two ways to reduce the thickness and the weight of the glass substrate. First, the glass substrate is etched. Second, a lighter and thinner glass substrate is adopted. With respect to the first solution, after the display panel is assembled, additional etching process is adopted to reduce the thickness and the weight of the glass substrate. The shortcoming of this solution is if the etching process fails, the manufacturing cost is greatly increased. With respect to the second solution, the thinner glass substrate may be bent, especially for large-scale glass substrate, and also the drooping and curving issues. In addition, when the glass substrate is transmitted, even small crash may cause the glass substrate to be bent when the glass substrate is loaded or unloaded, which damages the glass substrate. In addition, the pad area (non-display area) of the conventional flat displays usually occupied a greater dimension, which is contrary to the enhancement of the screen ratio and the user experience.

SUMMARY

In one aspect, a manufacturing method of liquid crystal panels includes: providing at least two glass substrates having a predetermined dimension; configuring the glass substrate to be spaced apart from a supporting substrate; forming at least one planarization portion between a gap of the glass substrates and forming a flexible substrate above the planarization portion and the glass substrates; forming a bonding area on the flexible substrate; conducting a cell-formation process or an encapsulation process of the display panel; stripping the supporting substrate; and cutting the flexible substrate via the gap between the glass substrates.

Wherein the supporting substrate is made by glass, and the supporting substrate has a thickness in a range from 0.5 mm to 1 mm, and the thickness of the glass substrate is in a range from 0.05 mm to 0.2 mm.

Wherein the step of configuring the glass substrate on the supporting substrate further includes: configuring the supporting substrate and the glass substrates to contact with each other so as to bond the supporting substrate with the glass substrates under vacuum condition, or bonding the supporting substrate and the glass substrate together via adhesive.

Wherein the step of forming at least one planarization portion between a gap of the glass substrates and forming a flexible substrate above the planarization portion and the glass substrates further includes: filling the gap between the glass substrates by packing material to form the planarization portion; coating flexible materials on the glass substrates and the planarization portion by a coating process; and curing the coated flexible material, or adhering the flexible substrate formed by the flexible material on the glass substrates and the planarization portion via adhesive.

Wherein the step of forming at least one planarization portion and the flexible substrate further include: coating flexible materials on the glass substrates by a coating process, flowing the flexible material into the gap between the glass substrates, and curing the flexible material.

Wherein the step of stripping the supporting substrate further includes: applying a plasma treatment to the supporting substrate, adopting laser beams to irradiate the gap between the glass substrates, or configuring a separation-type film layer between the planarization portion and the supporting substrate during a formation of the planarization portion; or forming a protrusion pattern on the surface of the supporting substrate, spraying air to the gap between the supporting substrate and the glass substrate via a predetermined air injection device; irradiating the gap between the glass substrates by the laser beams or configuring a separation-type film layer between the planarization portion and the supporting substrate during a formation of the planarization portion.

Wherein during the process of stripping the supporting substrate, if the planarization portion is separated from the supporting substrate, the flexible substrate and the planarization portion are separated by excimer laser after the flexible substrate is cut.

Wherein the step of providing at least two glass substrates having a predetermined dimension further includes: cutting a glass according to the predetermined dimension to form at least two glass substrates having the predetermined dimension.

In another aspect, a manufacturing method of liquid crystal panels includes: providing at least two top glass substrates and at least two down glass substrates having a predetermined dimension; configuring a down glass substrate to be spaced apart from a bottom supporting substrate, and the top glass substrate is spaced apart from a top supporting substrate, wherein each of the down glass substrate corresponds to one of the top glass substrate; forming a planarization portion between the down glass substrates and forming a flexible substrate above the planarization portion and the down glass substrate; forming an array layer and a bonding area on the flexible substrate, and forming a photo-resistor layer on the glass substrate; aligning the top supporting substrate and the bottom supporting substrate, and filling a liquid crystal layer between the photo-resistor layer and the array layer; stripping the top supporting substrate and the bottom supporting substrate; and cutting the flexible substrate via the gap between the down glass substrates.

In another aspect, a manufacturing method of organic electro-luminescent display panels includes: providing at least two glass substrates having a predetermined dimension; configuring the glass substrate to be spaced apart from a supporting substrate; forming at least one planarization portion between a gap of the glass substrates and forming a flexible substrate above the planarization portion and the glass substrates; forming an organic lighting layer and a bonding area on the flexible substrate; forming an encapsulation layer on the organic lighting layer; stripping the supporting substrate; and cutting the flexible substrate via the gap between the glass substrates.

In view of the above, the thicker supporting substrate is configured to support the glass substrate so as to avoid two ends of the thinner glass substrate from dropping and curing, which enhances the convenience and the precision of the manufacturing process of the display panel.

BRIEF DESCRIPTION OF THE DRAWINGS

Embodiments of the invention will now be described more fully hereinafter with reference to the accompanying drawings, in which embodiments of the invention are shown.

DETAILED DESCRIPTION OF THE EMBODIMENTS

Various example embodiments will now be described more fully with reference to the accompanying drawings in which some example embodiments are shown. In the drawings, the thicknesses of layers and regions may be exaggerated for clarity. In the following description, in order to avoid the known structure and/or function unnecessary detailed description of the concept of the invention result in confusion, well-known structures may be omitted and/or functions described in unnecessary detail.

FIGS. 1A-1G are schematic views of the manufacturing method of the liquid crystal display panel in accordance with a first embodiment.

The manufacturing method includes the following steps.

Figure 1A:
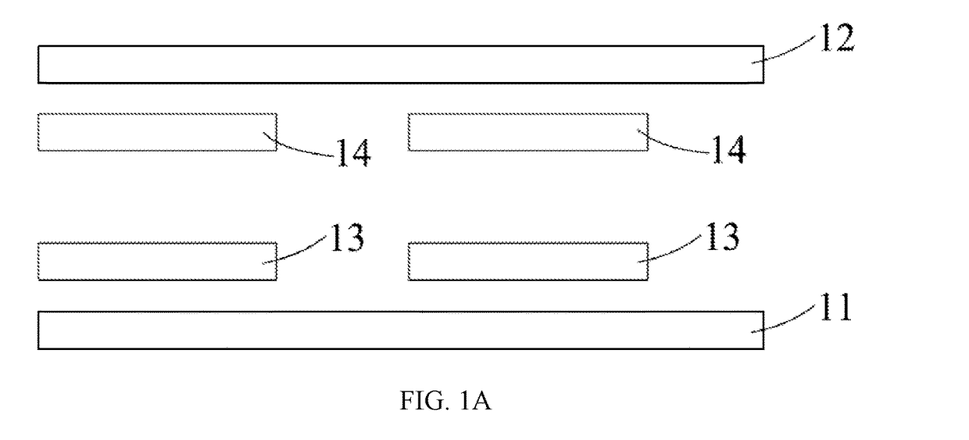
FIGS. 1A-1G are schematic views of the manufacturing method of the liquid crystal display panel in accordance with a first embodiment.

In step 1, referring to FIG. 1A, providing a bottom supporting substrate 11 and a top supporting substrate 12, and providing two down glass substrates 13 and two top glass substrates 14 having a predetermined dimension. It is to be noted that the numbers of the top glass substrates 14 and the down glass substrates 13 may be configured in accordance with real scenario, that is, the number of the top glass substrates 14 and the down glass substrates 13 is not limited to two.

The bottom supporting substrate 11 and the top supporting substrate 12 may be made by glass, ceramics, or metal. A thickness of the bottom supporting substrate 11 and the top supporting substrate 12 is in a range from 0.5 mm to 1 mm. In the embodiment, the bottom supporting substrate 11 and the top supporting substrate 12 are made by glass, and the thickness of the bottom supporting substrate 11 and the top supporting substrate 12 is 0.7 mm.

The step of obtaining the down glass substrates 13 and two top glass substrates 14 having a predetermined dimension further includes: cutting a large-scale glass in accordance with a predetermined dimension to form the two down glass substrates 13 and the two top glass substrates 14.

Figure 1B:
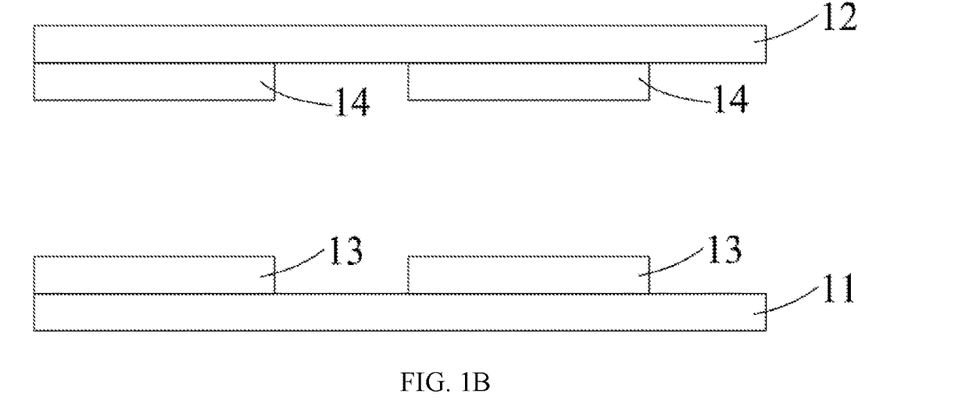

In step 2, referring to FIG. 1B, configuring the down glass substrates 13 to be spaced apart from the bottom supporting substrate 11, and configuring the top glass substrates 14 to be spaced apart from the top supporting substrate 12.

The down glass substrates 13 and the top glass substrates 14 are thinner, and the down glass substrates 13 and the top glass substrates 14 have the thickness ranging from 0.05 mm to 0.4 mm, preferably, in a range from 0.1 mm to 0.15 mm. The thinner glass substrate, such as the down glass substrates 13 and the top glass substrates 14, are configured to be above the thicker supporting substrate, such as the bottom supporting substrate 11 and the 12 and the 12. That is, the thicker supporting substrate is configured to support the glass substrate so as to avoid two ends of the thinner glass substrate from dropping and curing, which enhances the convenience and the precision of the manufacturing process of the display panel.

The step of configuring the down glass substrates 13 and top glass substrates 14 respectively on the bottom supporting substrate 11 and the top supporting substrate 12 further includes: 1) bonding the supporting substrate and the glass substrate via adhesive forces, such as static electricity, vacuum forces, or surface tension forces, under a vacuum condition; 2) the supporting substrate and the glass substrate are bonded together via adhesive.

Figure 1C:
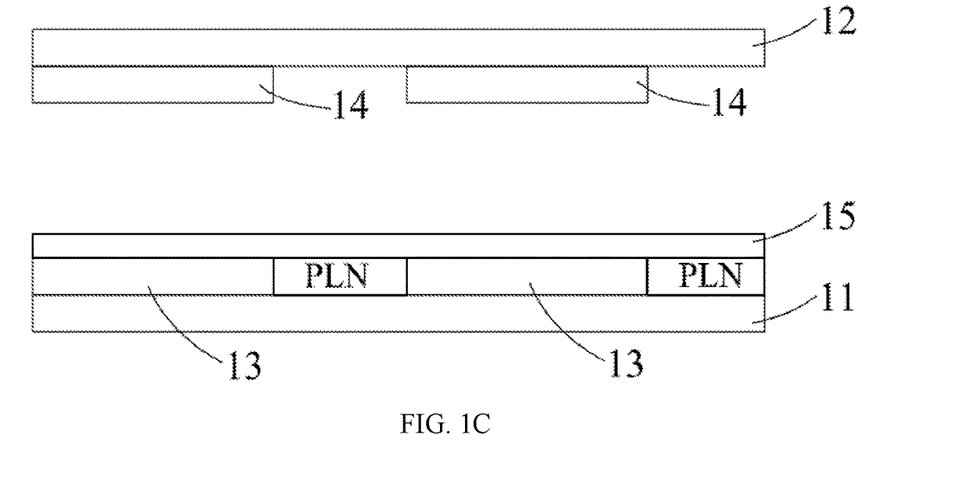

In step 3, referring to FIG. 1C, configuring at least one planarization portion (PLN) between the down glass substrates 13 and forming a foldable flexible substrate 15 above the planarization portion (PLN) and the down glass substrates 13.

The flexible substrate 15 may be made by one polymer or a combinations of the polymer, and the polymer includes PI, PC, PES, PET, PEN, PAR, or FRP.

Specifically, the planarization portion (PLN) and the flexible substrate 15 made be made by two methods below.

First method: filling a gap between the down glass substrates 13 by packing material to form the planarization portion (PLN), coating flexible materials, i.e., the materials forming the flexible substrate 15, on the down glass substrates 13 and the planarization portion (PLN) by a coating process, including spin coating, slit coating, and inkjet coating, and curing the coated flexible material, or adhering the flexible substrate 15 formed by the flexible material on the down glass substrates 13 and the planarization portion (PLN) via adhesive. The packing material may be the adhesive or the organic/inorganic materials adopted to form the planarization portion (PLN) of the TFTs.

Second method: flowing the flexible material into the gap between the down glass substrates 13 via the coating process, and curing the flexible material. The coating process includes spin coating, slit coating, and inkjet coating, and the flexible material is the material forming the flexible substrate 15. The flexible material filled within the gap between the down glass substrates 13 are cured to form the planarization portion (PLN), that is, the planarization portion (PLN) and the flexible substrate 15 are integrally formed.

In one embodiment, the flexible substrate 15 includes more than one organic layer, that is, the flexible substrate 15 includes two or more than two organic layers. At the same time, the organic layer may include one, two, or more than two inorganic layers, wherein the inorganic layer is made by $SiN_x$ and/or $SiO_x$.

Figure 1D:
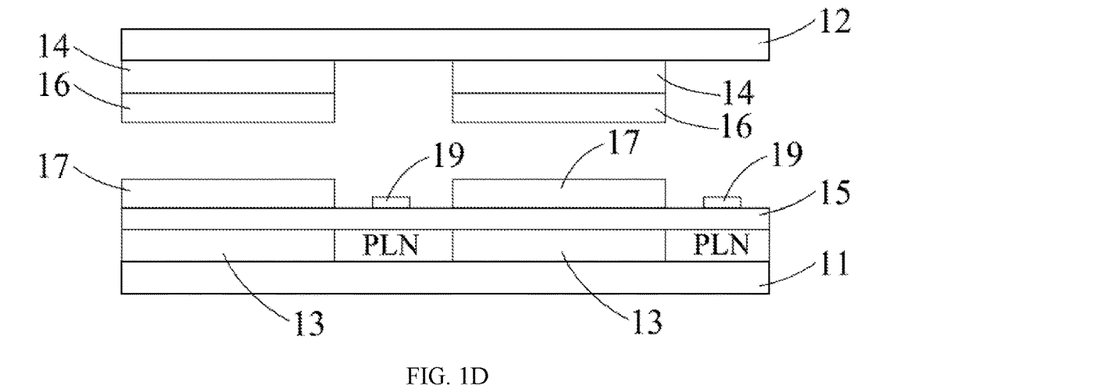

In step 4: referring to FIG. 1D, arranging an array layer 17 and a bonding are 19 on the flexible substrate 15. Correspondingly, arranging a photo-resistor layer 16 on the top glass substrates 14. It is to be noted that the flexible substrate 15 and the top glass substrates 14 may respectively include other display components. In addition, the back plate 10 is configured in the non-display area of the display panel. In an example, the bonding are 19 is equivalent to the non-display area of the liquid crystal panel.

Figure 1E:
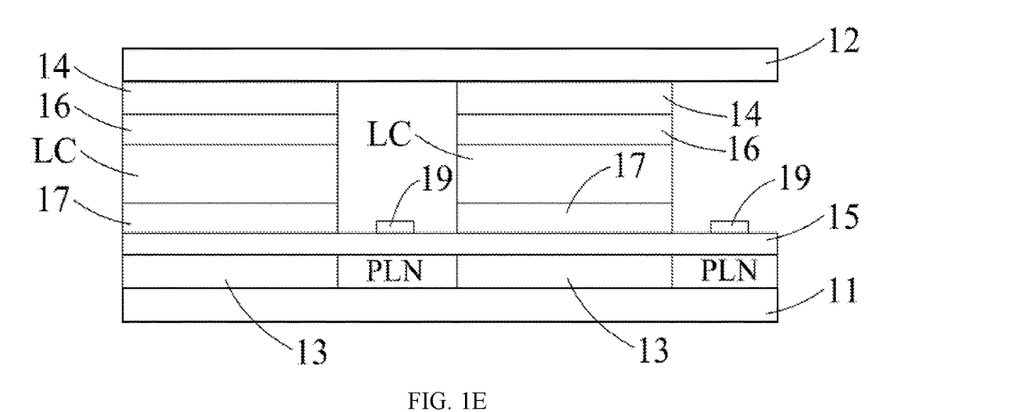

In step 5, referring to FIG. 1E, aligning the top supporting substrate 12 and the bottom supporting substrate 11, and filling a liquid crystal layer (LC) between the photo-resistor layer 16 and the array layer 17 to form a cell of the liquid crystal panel.

The top supporting substrate 12 and the bottom supporting substrate 11 not only can protect the down glass substrates 13, the top glass substrates 14, the display components between the down glass substrates 13 and the top glass substrates 14, but also may enhance the convenience and the precision of the manufacturing process of the display panel.

Figure 1F:
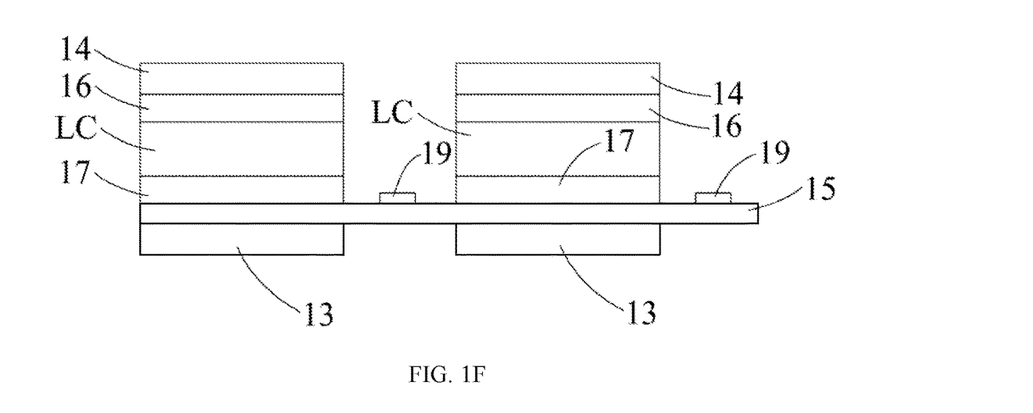

In step 6, referring to FIG. 1F, stripping the top supporting substrate 12 and the bottom supporting substrate 11.

Specifically, the step of stripping the top supporting substrate 12 and the bottom supporting substrate 11 may include the following two methods.

The first method relates to providing a separation-type film layer between the flat portion PLN and the lower support substrate 11 when the support substrate is subjected to plasma treatment using fluorine or the like, and the gap between the glass substrates 13 is irradiated with the laser light beams or the flat portion PLN is formed. Second, by forming a protrusion pattern on the surface of the supporting substrate in advance to reduce the adhesion force between the glass substrate and the supporting substrate. The air is sprayed by the predetermined air injection device (not shown) to the gap between supporting substrate and the glass substrate so as to strip the supporting substrate. In addition, the separation-type film layer is provided between the gap between the down glass substrates 13 or between the planarization portion (PLN) and the bottom supporting substrate 11 by laser irradiation.

Figure 1G:
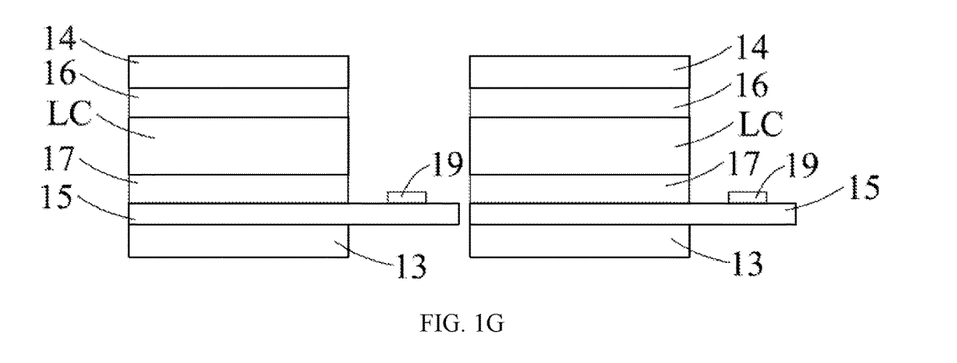
Figure 2:
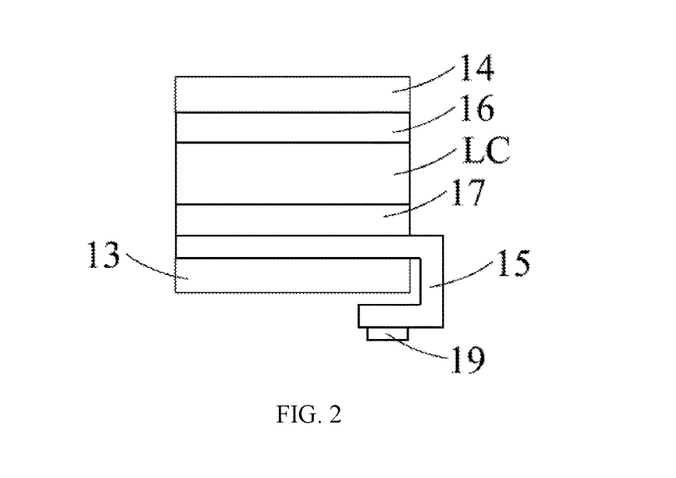
FIG. 2 is a schematic view showing the bent flexible substrate of the liquid crystal panel manufactured by the manufacturing method in the first embodiment.

In step 7, referring to FIG. 1G, cutting the flexible substrate 15 via the gap between the down glass substrates 13 to cut the flexible substrate 15 connected between the two adjacent liquid crystal panels so as to obtain two independent liquid crystal panels as shown in FIG. 1G. It is to be noted that FIG. 1F only shows two liquid crystal panels, however, three or more liquid crystal panels may be formed in real scenarios.

It is to be noted that when the planarization portion (PLN) is formed in step 3, during the process of stripping the bottom supporting substrate 11, if the planarization portion (PLN) is separated from the bottom supporting substrate 11, the flexible substrate 15 and the planarization portion (PLN) are separated by excimer laser after the flexible substrate 15 is cut.

In view of the above, the liquid crystal panel manufactured by the manufacturing method in the first embodiment not only has an uniform cell thickness, but also may provide a flat and smooth display surface.

FIGS. 3A-3G are schematic views of the manufacturing method of the liquid crystal display panel in accordance with a second embodiment.

The manufacturing method includes the following steps.

Figure 3A:
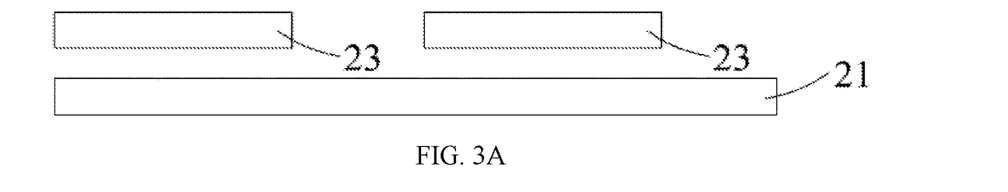
FIGS. 3A-3G are schematic views of the manufacturing method of the liquid crystal display panel in accordance with a second embodiment.

In step 1, referring to FIG. 3A, providing a bottom supporting substrate 21 and two down glass substrates 23 having a predetermined dimension. It is to be noted that the numbers of the down glass substrates 23 may be configured in accordance with real scenario, that is, the number of the down glass substrates 23 is not limited to two.

The bottom supporting substrate 21 and the top supporting substrate 22 may be made by glass, ceramics, or metal. A thickness of the bottom supporting substrate 21 and the top supporting substrate 22 is in a range from 0.5 mm to 1 mm. In the embodiment, the bottom supporting substrate 21 and the top supporting substrate 22 are made by glass, and the thickness of the bottom supporting substrate 21 and the top supporting substrate 22 is 0.7 mm.

The step of obtaining the two down glass substrates 23 having a predetermined dimension further includes: cutting a large-scale glass in accordance with a predetermined dimension to form the two down glass substrates 23.

Figure 3B:
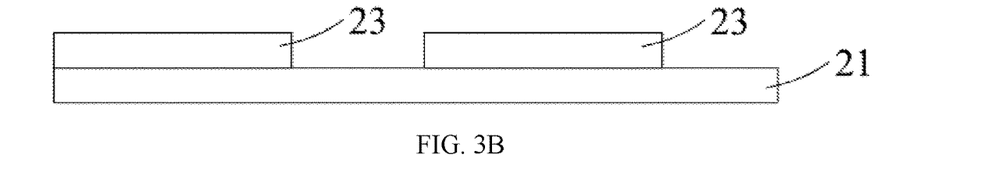

In step 2, referring to FIG. 3B, configuring the down glass substrates 23 to be spaced apart from the bottom supporting substrate 21.

The down glass substrates 23 is thinner, and has a thickness ranging from 0.1 mm to 0.25 mm. The thinner down glass substrates 23 is configure above the bottom supporting substrate 21 such that the thicker bottom supporting substrate 21 may support the down glass substrates 23. In addition, two ends of the thinner down glass substrates 23 are prevented from dropping and curving, which enhances the convenience and the precision of the manufacturing process of the display panel.

The step of configuring the down glass substrates 23 on the bottom supporting substrate 21 further includes: 1) configuring the bottom supporting substrate 21 and the down glass substrates 23 to contact with each other so as to bond the bottom supporting substrate 21 with the down glass substrates 23 under vacuum condition. The bottom supporting substrate 21 and the down glass substrates 23 are bonded via adhesive forces, such as static electricity, vacuum forces, or surface tension forces; 2) the bottom supporting substrate 21 and the down glass substrates 23 are bonded together via adhesive.

Figure 3C:
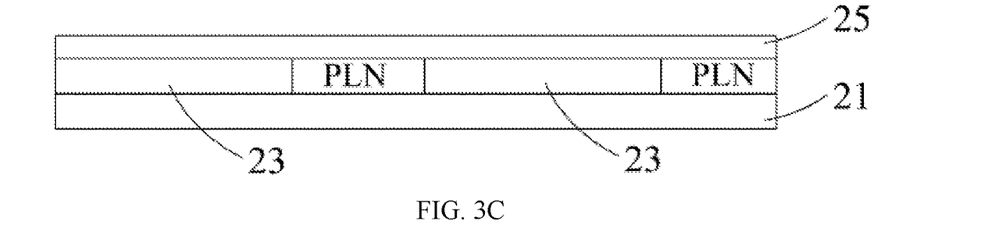

In step 3, referring to FIG. 3C, configuring at least one planarization portion (PLN) between the down glass substrates 23 and configuring a flexible substrate 25 on the planarization portion (PLN) and the down glass substrates 23.

The flexible substrate 25 may be made by one polymer or a combinations of the polymer, and the polymer includes PI, PC, PES, PET, PEN, PAR, or FRP.

Specifically, the planarization portion (PLN) and the flexible substrate 15 made be made by two methods below.

First method: filling a gap between the down glass substrates 23 by packing material to form the planarization portion (PLN), coating flexible materials, i.e., the materials forming the flexible substrate 25, on the down glass substrates 23 and the planarization portion (PLN) by a coating process, including spin coating, slit coating, and inkjet coating, and curing the coated flexible material, or adhering the flexible substrate 25 formed by the flexible material on the down glass substrates 23 and the planarization portion (PLN) via adhesive. The packing material may be the adhesive or the organic/inorganic materials adopted to form the planarization portion (PLN) of the TFTs.

Second method: flowing the flexible material into the gap between the down glass substrates 23 via the coating process, and curing the flexible material. The coating process includes spin coating, slit coating, and inkjet coating, and the flexible material is the material forming the flexible substrate 25. The flexible material filled within the gap between the down glass substrates 23 are cured to form the planarization portion (PLN), that is, the planarization portion (PLN) and the flexible substrate 25 are integrally formed.

In one embodiment, the flexible substrate 25 includes more than one organic layer, that is, the flexible substrate 25 includes two or more than two organic layers. At the same time, the organic layer may include one, two, or more than two inorganic layers, wherein the inorganic layer is made by $SiN_x$ and/or $SiO_x$.

Figure 3D:
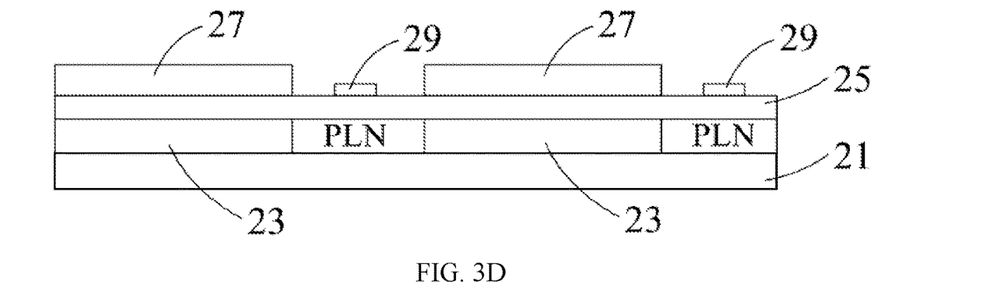

In step 4: referring to FIG. 3D, arranging an array layer 27 and a bonding are 29 on the flexible substrate 25. It is to be noted that the flexible substrate 25 may respectively include other display components. In addition, the bonding are 29 is configured in the non-display area of the display panel. In an example, the bonding are 29 is equivalent to the non-display area of the liquid crystal panel.

Figure 3E:
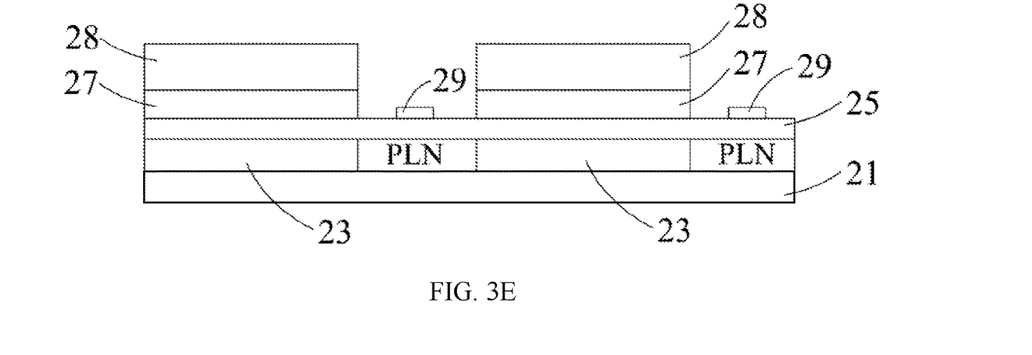

In step 5, referring to FIG. 3E, configuring an encapsulation layer 28 on the organic lighting layer 27 to separate vapor and oxygen. The encapsulation layer 28 may be a glass cover or a thin film encapsulation layer.

Figure 3F:
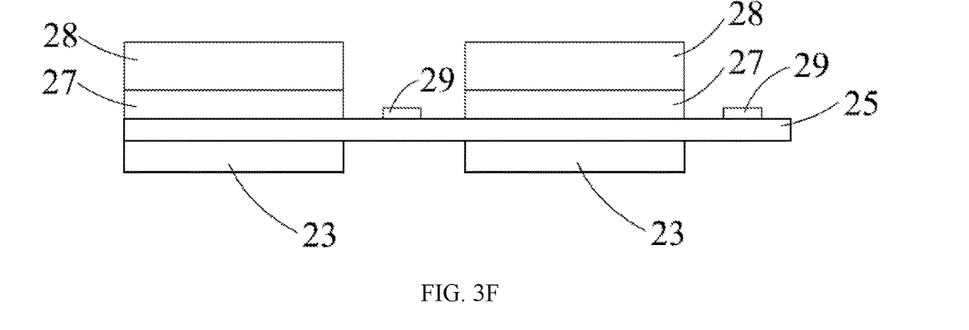
Figure 3G:
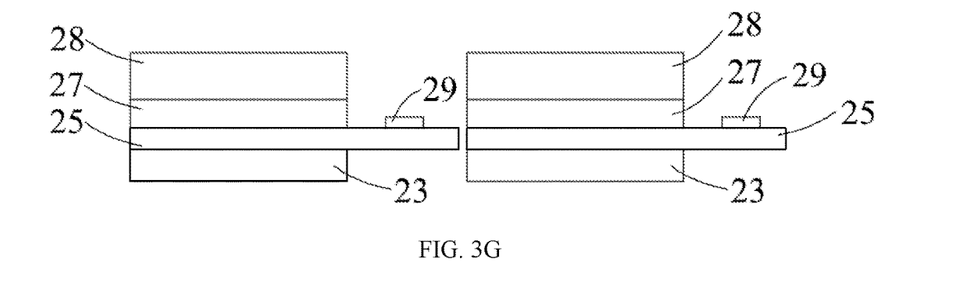

In step 6, referring to FIG. 3F, stripping the bottom supporting substrate 21.

The first method relates to providing a separation-type film layer between the flat portion PLN and the lower support substrate 21 when the support substrate is subjected to plasma treatment using fluorine or the like, and when the gap between the glass substrates 23 is irradiated with the laser light beams or when the flat portion PLN is formed. Second, by forming a protrusion pattern on the surface of the bottom supporting substrate 21 in advance to reduce the adhesion force between the down glass substrate 23 and the bottom supporting substrate 21. The air is sprayed by the predetermined air injection device (not shown) to the gap between bottom supporting substrate 23 and the down glass substrate 21 so as to strip the supporting substrate. In addition, the separation-type film layer is provided between the gap between the down glass substrates 23 or between the planarization portion (PLN) and the bottom supporting substrate 21 by laser irradiation.

It is to be noted that when the planarization portion (PLN) is formed in step 3, during the process of stripping the bottom supporting substrate 21, if the planarization portion (PLN) is separated from the bottom supporting substrate 21, the flexible substrate 25 and the planarization portion (PLN) are separated by excimer laser after the flexible substrate 25 is cut.

In view of the above, the liquid crystal panel manufactured by the manufacturing method in the first embodiment not only has an uniform cell thickness, but also may provide a flat and smooth display surface.

Figure 4:
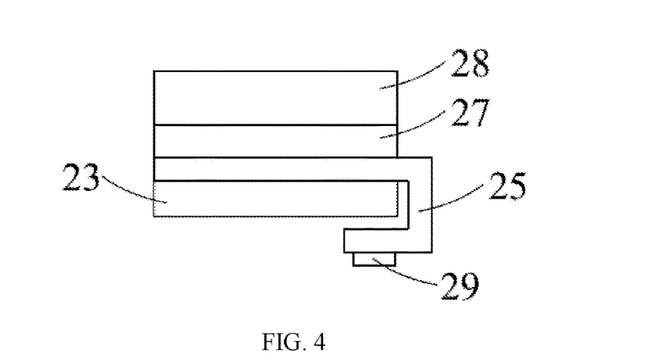
FIG. 4 is a schematic view showing the bent flexible substrate of the liquid crystal panel manufactured by the manufacturing method in the second embodiment.

In addition, referring to FIG. 4, with respect to each of the organic electro-luminescent display panels, a length of the flexible substrate 25 is greater than that of the down glass substrates 23, such that the flexible substrate 25 may be bent. As such, the bonding area 29 is below the down glass substrates 23 and extends toward an internal of electronic devices, so as to increase the screen ratio of the electronic devices, such as smart phones, tablets, and smart watches.

In view of the above, the liquid crystal panel manufactured by the manufacturing method in the first embodiment not only has an uniform cell thickness, but also may provide a flat and smooth display surface.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A manufacturing method of liquid crystal panels, comprising:
    providing at least a first glass substrate and a second glass substrate having a predetermined dimension;
    configuring the first glass substrate and the second glass substrate on a supporting substrate, and the first glass substrate and the second glass substrate being configured to be spaced apart from each other;
    forming at least one planarization portion between a gap of the first glass substrate and the second glass substrates and forming a flexible substrate above the planarization portion and the first and the second glass substrates;
    forming a bonding area on the flexible substrate, and a location of the bonding area corresponding to a location of the planarization portion;
    conducting a cell-formation process or an encapsulation process of the display panel;
    stripping the supporting substrate; and
    cutting the flexible substrate via the gap between the first and the second glass substrates.

2. The manufacturing method as claimed in claim 1, wherein the supporting substrate is made of glass, and the supporting substrate has a thickness in a range from 0.5 mm to 1 mm, and the thickness of the glass substrate is in a range from 0.05 mm to 0.2 mm.

3. The manufacturing method as claimed in claim 1, wherein the step of configuring the first and the second glass substrates on the supporting substrate further comprises:
    configuring the supporting substrate and the first and the second glass substrates to contact with each other so as to bond the supporting substrate with the first and the second glass substrates under vacuum condition, or bonding the supporting substrate and the first and the second glass substrate together via adhesive.

4. The manufacturing method as claimed in claim 1, wherein the step of forming at least one planarization portion between a gap of the first and the second glass substrates and forming the flexible substrate above the planarization portion and the first and the second glass substrates further comprises:
    filling the gap between the first and the second glass substrates by packing material to form the planarization portion;
    coating flexible materials on the first and the second glass substrates and the planarization portion by a coating process; and
    curing the coated flexible material, or adhering the flexible substrate formed by the flexible material on the first and the second glass substrates and the planarization portion (PLN) via adhesive.

5. The manufacturing method as claimed in claim 4, wherein during the process of stripping the supporting substrate, if the planarization portion is separated from the supporting substrate, the flexible substrate and the planarization portion are separated by excimer laser after the flexible substrate is cut.

6. The manufacturing method as claimed in claim 1, wherein the step of forming at least one planarization portion and the flexible substrate further comprise:
    coating flexible materials on the first and the second glass substrates by a coating process, flowing the flexible material into the gap between the first and the second glass substrates, and curing the flexible material.

7. The manufacturing method as claimed in claim 1, wherein the step of stripping the supporting substrate further comprises:
   applying a plasma treatment to the supporting substrate, adopting laser beams to irradiate the gap between the first and the second glass substrates, or configuring a separation-type film layer between the planarization portion and the supporting substrate during a formation of the planarization portion; or
   forming a protrusion pattern on the surface of the supporting substrate, spraying air to the gap between the supporting substrate and the first and the second glass substrate via a predetermined air injection device;
   irradiating the gap between the first and the second glass substrates by the laser beams or configuring a separation-type film layer between the planarization portion and the supporting substrate during a formation of the planarization portion.

8. The manufacturing method as claimed in claim 1, wherein the step of providing at least two first and the second glass substrates having a predetermined dimension further comprises:
   cutting a glass according to the predetermined dimension to form at least the two first and the second glass substrates having the predetermined dimension.

9. A manufacturing method of liquid crystal panels, comprising:
   providing at least two first and the second top glass substrates and at least two first and the second down glass substrates having a predetermined dimension;
   configuring the first and the second down glass substrate to be spaced apart from each other on a bottom supporting substrate, and configuring the first and the second top glass substrate to be spaced apart from each other on a top supporting substrate, wherein each of the first and the second down glass substrate respectively corresponds to the first and the second top glass substrate;
   forming a planarization portion between the first and the second down glass substrates and forming a flexible substrate above the planarization portion and the first and the second down glass substrates;
   forming an array layer and a bonding area on the flexible substrate in an alternated configuration, and forming a photo-resistor layer on the first and the second top glass substrates;
   aligning the top supporting substrate and the bottom supporting substrate, and filling a liquid crystal layer between the photo-resistor layer and the array layer;
   stripping the top supporting substrate and the bottom supporting substrate; and
   cutting the flexible substrate via the gap between the first and the second down glass substrates.

10. A manufacturing method of organic electro-luminescent display panels, comprising:
   providing at least two first and the second glass substrates having a predetermined dimension;
   configuring the first and the second glass substrates on a supporting substrate, and configuring the first and the second glass substrates to be spaced apart from each other;
   forming at least one planarization portion between a gap of the first and the second glass substrates and forming a flexible substrate above the planarization portion and the first and the second glass substrates;
   forming an organic lighting layer and a bonding area on the flexible substrate, and a location of the bonding area corresponding to a location of the planarization portion;
   forming an encapsulation layer on the organic lighting layer;
   stripping the supporting substrate; and
   cutting the flexible substrate via the gap between the first and the second glass substrates.

* * * * *